United States Patent
Jo et al.

(10) Patent No.: US 8,569,172 B1
(45) Date of Patent: Oct. 29, 2013

(54) NOBLE METAL/NON-NOBLE METAL ELECTRODE FOR RRAM APPLICATIONS

(75) Inventors: Sung Hyun Jo, Sunnyvale, CA (US);
Kuk-Hwan Kim, San Jose, CA (US);
Tanmay Kumar, Pleasanton, CA (US)

(73) Assignee: Crossbar, Inc., Santa Clara ( * ) Notice: Subject to any disclaimer, the term of this patent is extended or adjusted under 35 U.S.C. 154(b) by 0 days.

(21) Appl. No.: 13/585,759

(22) Filed: Aug. 14, 2012

(51) Int. Cl.
*H01L 21/44* (2006.01)
*H01L 21/00* (2006.01)

(52) U.S. Cl.
USPC ........... 438/686; 438/381; 438/685; 257/261; 257/608; 257/E27.004; 257/E25.014; 365/148; 365/174

(58) Field of Classification Search
None
See application file for complete search history.

(56) References Cited

U.S. PATENT DOCUMENTS

| | | | |
|---|---|---|---|
| 5,627,451 A | 5/1997 | Takeda | |
| 7,667,442 B2 | 2/2010 | Itoh | |
| 7,704,788 B2 | 4/2010 | Youn et al. | |
| 7,830,698 B2 | 11/2010 | Chen et al. | |
| 2006/0231910 A1* | 10/2006 | Hsieh et al. | 257/413 |
| 2006/0286762 A1 | 12/2006 | Tseng et al. | |
| 2007/0069119 A1 | 3/2007 | Appleyard et al. | |
| 2007/0171698 A1 | 7/2007 | Hoenigschmid et al. | |
| 2008/0019163 A1 | 1/2008 | Hoenigschmid et al. | |
| 2008/0165571 A1 | 7/2008 | Lung | |
| 2008/0278988 A1 | 11/2008 | Ufert | |
| 2008/0301497 A1 | 12/2008 | Chung et al. | |
| 2009/0014707 A1* | 1/2009 | Lu et al. | 257/4 |
| 2009/0321706 A1 | 12/2009 | Happ et al. | |
| 2010/0237314 A1 | 9/2010 | Tsukamoto et al. | |
| 2010/0277969 A1 | 11/2010 | Li et al. | |
| 2011/0204314 A1 | 8/2011 | Baek et al. | |
| 2011/0310656 A1 | 12/2011 | Kreupl et al. | |
| 2012/0044751 A1* | 2/2012 | Wang et al. | 365/148 |
| 2012/0176831 A1* | 7/2012 | Xiao et al. | 365/148 |

OTHER PUBLICATIONS

International Search Report and Written Opinion for PCT/US2011/040362 filed on Jun. 14, 2011.
Office Action for U.S. Appl. No. 12/815,369 dated Mar. 14, 2012.
Notice of Allowance for U.S. Appl. No. 12/815,369 dated May 22, 2012.
Office Action for U.S. Appl. No. 12/834,610 dated Apr. 16, 2012.
R C Newman, "Defects in silicon", Rep. Prog. Phys., 1982, pp. 1163-1210, vol. 45, The Institute of Physics, Great Britain.
Office Action for U.S. Appl. No. 13/149,757 dated Jun. 19, 2012.

* cited by examiner

*Primary Examiner* — Julio J Maldonado
*Assistant Examiner* — Joseph Galvin, III
(74) *Attorney, Agent, or Firm* — Ogawa P.C.

(57) ABSTRACT

A method for forming a non-volatile memory device includes disposing a junction layer comprising a doped silicon-bearing material in electrical contact with a first conductive material, forming a switching layer comprising an undoped amorphous silicon-bearing material upon at least a portion of the junction layer, disposing a layer comprising a non-noble metal material upon at least a portion of the switching layer, disposing an active metal layer comprising a noble metal material upon at least a portion of the layer, and forming a second conductive material in electrical contact with the active metal layer.

21 Claims, 5 Drawing Sheets

NOBLE METAL/NON-NOBLE METAL ELECTRODE FOR RRAM APPLICATIONS

The inventors of the present invention have recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventors of the present invention recognize that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, a new semiconductor device structure and integration is desirable.

BRIEF SUMMARY OF THE PRESENT INVENTION

The present invention is generally related to resistive switching devices. More particularly, embodiments according to the present invention relate to methods and apparatus for controlling oxygen levels in a resistive switching device. Embodiments according to the present invention can be applied to non-volatile memory devices but it should be recognized that the present invention can have a much broader range of applicability.

In a specific embodiment, a method for forming a non-volatile memory device includes forming a bottom metal electrode; forming a junction layer in electrical contact with the bottom metal electrode, with a conductive silicon-bearing material (e.g. p-doped polysilicon, p-doped silicon germanium, or the like); and forming a switching layer over the junction layer, with an undoped amorphous silicon-bearing material (e.g. undoped amorphous silicon, undoped SiOx, SixGeyOz, where x, y and z are integers, or the like). In a specific embodiment, a barrier layer is formed over the switching layer with a non-noble material (e.g. titanium, aluminum, tungsten, titanium alloy, aluminum alloy, tungsten alloy, titanium nitride, tungsten nitride, aluminum nitride, copper, copper alloy, or the like); an active layer is formed over the barrier layer with a noble material (e.g. silver, gold, platinum, palladium, or the like); and another barrier layer (top layer) is formed over the active layer. Subsequently, a top metal electrode is formed in electrical contact with the top layer and active layer.

In various embodiments, the as-deposited or as-formed layer is configured to receive oxygen and be oxidized. As one example, the non-noble material used in the layer is titanium, and as the titanium receives oxygen, it is converted into titanium dioxide, or other oxidized form of titanium. Oxygen used for the oxidation of titanium may be drawn from the switching layer, from the active layer, or from any other source (e.g. atmosphere) via migration through the switching layer, active layer, or the like. In an oxidized form, the layer may have a thickness range of about 2 nm to about 3 nm.

According to one aspect of the invention, a method for forming a non-volatile memory device is described. One process includes disposing a junction layer comprising a doped silicon-bearing material in electrical contact with a first conductive material, and forming a switching layer comprising an undoped amorphous silicon-bearing material upon at least a portion of the junction layer. A technique includes disposing a barrier layer comprising a non-noble metal material upon at least a portion of the switching layer, and disposing an active metal layer comprising a noble metal material upon at least a portion of the barrier layer. A method may include forming an additional barrier layer on top of the active metal layer, followed by a second conductive material in electrical contact with the active metal layer.

According to another aspect of the invention, a non-volatile memory device is described. One device may include a junction layer comprising a doped silicon-bearing material electrically coupled to a first conductive material, and a switching layer comprising an undoped amorphous silicon-bearing material formed upon at least a portion of the doped silicon-bearing material. A memory may include a first layer comprising a noble metal material disposed above at least a portion of the switching layer, a second conductive material electrically coupled to the first layer, and a layer comprising an oxidized form of a non-noble metal material formed between at least a portion of the first layer and at least a portion of the switching layer.

Many benefits can be achieved by ways of the present invention. For example, embodiments according to the present invention provide a method for increasing performance of a non-volatile memory device, such as device reliability, device off-state current consistency, device thickness uniformity, device retention, and the like. The present methods use conventional semiconductor equipment and techniques without modification. Depending on the embodiment, one or more of these benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not necessarily to scale and are not to be considered limitations in the scope of the invention. The presently described embodiments and the presently understood best mode of the invention are described with additional detail through use of the accompanying drawings in which.

DETAILED DESCRIPTION OF THE PRESENT INVENTION

Embodiments according to the present invention are directed to resistive switching devices. More particularly, embodiments according to the present invention provide methods to form a silver structure for the resistive switching device. The present method has been applied to fabrication of a non-volatile memory device but it should be recognized that embodiments according to the present invention can have a much broader range of applicability.

Figure 1:
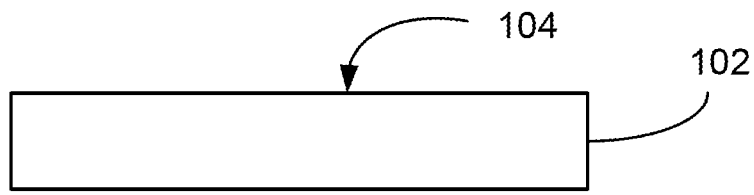
FIG. 1 is a simplified diagram illustrating a process step according to various embodiments of the present invention.

For resistive switching devices using amorphous silicon as a switching material, a metal material is used for at least one of the electrodes. The resistance of the amorphous silicon material is caused to change depending on one or more conductor particles derived from a conductor electrode upon application of a potential difference between the electrodes. FIGS. 1-12 illustrate a method of forming a resistive switching device for a memory device according to various embodiments of the present invention. As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon or therein. The one or more MOS devices can be controlling circuitry for the resistive switching device, or the like in some embodiments.

Figure 2:
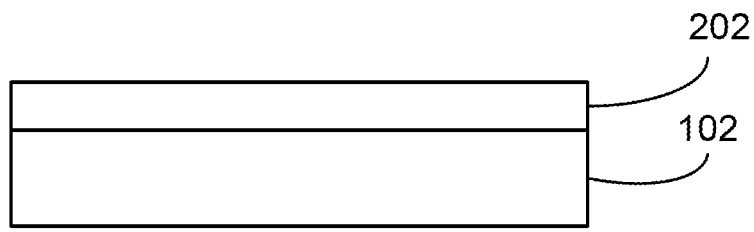
FIG. 2 is a simplified diagram illustrating a process step according to various embodiments of the present invention.

As illustrated in FIG. 2, embodiments of the method include depositing a first dielectric material 202 overlying the semiconductor substrate 102. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 3:
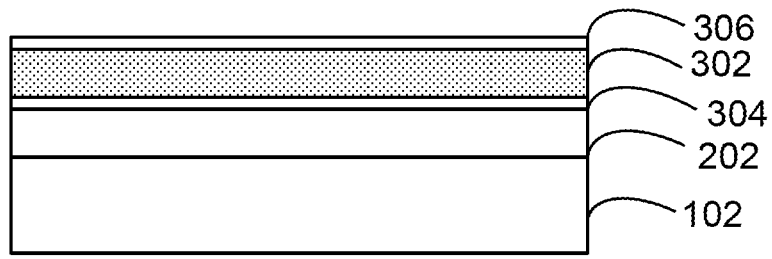
FIG. 3 is a simplified diagram illustrating a process step according to various embodiments of the present invention.

Referring to FIG. 3, embodiments of the method include depositing a first wiring material 302 overlying the first dielectric material. First wiring material 302 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 304 is first formed overlying the first dielectric material 202 before deposition of the first wiring material 302 to promote adhesion of the first wiring material 302 to the first dielectric material 202. A diffusion barrier material 306 may also be formed overlying the first wiring material 302 to prevent, for example, the conductive material, the metal material, gasses, oxygen, or the like to contaminate other portions of the device in a specific embodiment.

Figure 4:
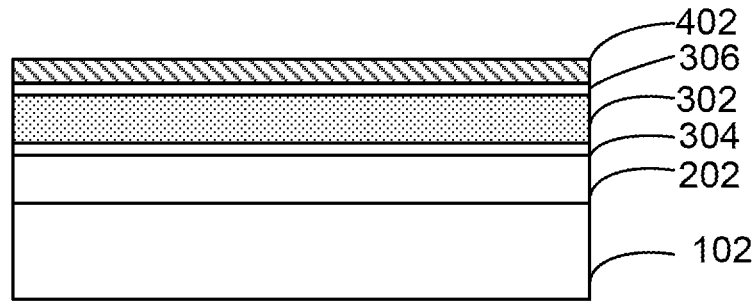
FIG. 4 is a simplified diagram illustrating a process step according to various embodiments of the present invention.

Referring to FIG. 4, the method includes forming a junction material 402 overlying at least the first wiring material 302 (or first diffusion barrier material 306, if used). First junction material 402 can be a p-doped silicon-bearing material (e.g. p++ polysilicon, p-doped silicon-germanium, or the like) in a specific embodiment. The p++ polysilicon material can be formed by using a deposition process such as a low pressure chemical vapor deposition process a plasma enhanced chemical vapor deposition process using silane ($SiH_4$) or disilane ($Si_2H_6$), or a suitable chlorosilane depending on the application. Alternatively, the first silicon material can be deposited using a physical vapor deposition process from a suitable silicon target. Deposition temperature can range from about 380 Degree Celsius to about 450 Degree Celsius, and preferably not higher than 440 Degree Celsius. In a specific embodiment, the p++ polysilicon material is deposited using a low pressure chemical vapor deposition process using disilane at a deposition temperature ranging from about 400 Degree Celsius to about 460 Degree Celsius.

Figure 5:
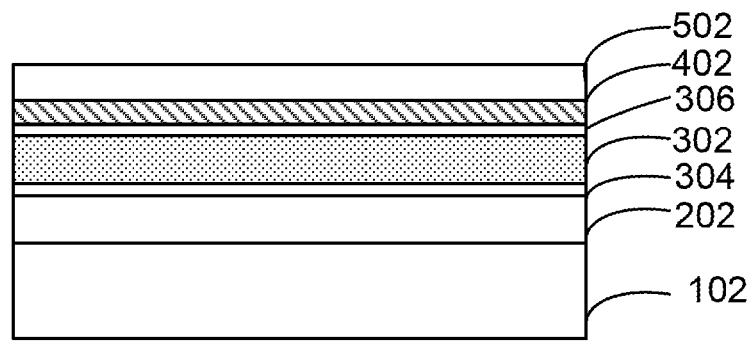
FIG. 5 is a simplified diagram illustrating a process step according to various embodiments of the present invention.

Referring to the example in FIG. 5, the method deposits a resistive switching material 502 overlying junction material 402. Resistive switching material 502 can be a silicon material. The silicon material can be an amorphous silicon material or a polycrystalline silicon material, and others, depending on the embodiment. In a specific embodiment, resistive switching material 502 comprises an amorphous silicon material. The switching material is characterized by a state, for example, a resistance state dependent on an electric field in the switching material. In a specific embodiment, the switching material is an amorphous silicon material. Resistive switching material 502 has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies.

Deposition techniques can include a chemical vapor deposition process (CVD), physical vapor deposition (PVD) process, an atomic layer deposition (ALD) process, and others. The chemical vapor process can be a low pressure chemical vapor deposition process, plasma enhanced chemical vapor deposition process, deposited using precursors such as silane, disilane, a suitable chlorosilane in a reducing environment, a combination, and others. Deposition temperature can range from 250 Degree Celsius to about 500 Degree Celsius. In some cases, deposition temperature ranges from about 400 Degree Celsius to about 440 Degree Celsius and no greater than about 450 Degree Celsius. In an exemplary process, a mixture of silane ($SiH_4$)(45 sccm) and Helium (He) (500 sccm) is used to form an a-Si layer with a deposition rate of 80 nm per minute (T=260° C., P=600 mTorr) during PECVD. In another exemplary process, a mixture of silane ($SiH_4$)(190 sccm) and Helium (He) (100 sccm) is used to form an a-Si layer with a deposition rate of 2.8 A per second (T=380° C., P=2.2 Torr) during PECVD. In another exemplary process, silane ($SiH_4$ 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In various embodiments, a thickness for the amorphous silicon material is typically within a range of about 10 nm to about 30 nm thick. In other embodiments, other thicknesses may be used, depending upon specific performance characteristics desired (e.g. switching voltage, retention characteristics, current, or the like).

In yet another embodiment, the resistive switching material 502 may be formed from an upper region (e.g. away from first wiring layer 302) of junction material 402 (e.g. p+ polycrystalline silicon bearing layer). In various embodiments, the exposed surface of junction material 402 is subject to a plasma etch using Argon, Silicon, Oxygen, or combinations thereof to effect an amorphization of junction material 402 with the upper region. In some examples, a plasma etch may use a bias power within a range of approximately 30 watts to approximately 120 watts to convert an upper region of junction material 402 into resistive switching material 502.

In some specific examples, when junction material 402 is a doped polysilicon material, the amorphization process creates a $SiO_x$ material for resistive switching material 502. In other specific examples, when junction material 402 is a doped silicon-germanium material, the amorphization process creates a $Si_xGe_yO_z$ (x, y, z integers) material for as resistive switching material 502. In some examples, the resulting resistive switching material 502 may have a thickness in the range of approximately 2 nm to approximately 5 nm. In other embodiments, other thicknesses are contemplated, in light of the specific engineering requirements.

Figure 6:
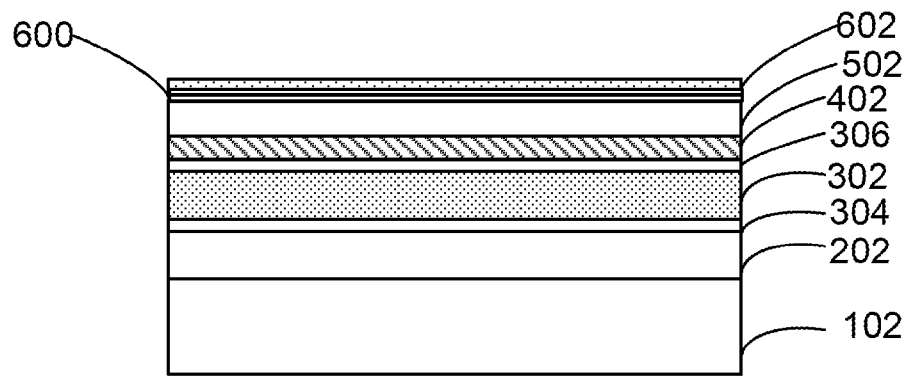
FIG. 6 is a simplified diagram illustrating a process step according to various embodiments of the present invention.

As shown in FIG. 6, in various embodiments, the method includes depositing a layer 600 that may be a barrier layer, overlying resistive switching material 502. In various embodiments, barrier layer 600 may be embodied as a non-noble metal, such as titanium, aluminum, tungsten, titanium alloy, aluminum alloy, tungsten alloy, titanium nitride, tungsten nitride, aluminum nitride, copper, copper alloy, or the like. The non-noble metal is configured to oxidize, absorb and lock-in oxygen. As one example, if layer 600 is titanium, the titanium oxidizes for form a titanium oxide, or other non-conductive layer.

In some embodiments, layer 600 may have an as-deposited thickness of approximately 1 nm to approximately 5 nm, and after oxidation, layer 600 may have a slightly larger thickness. As an example, layer 600 may increase from an as-deposited thickness of 2.5 nm to an oxidized thickness of 3 nm, or the like.

In various embodiments, the source of oxygen may come from any number of sources, including atmospheric oxygen after layer 600 is formed; oxygen present in resistive switching material 502 during formation or after formation; oxygen present in an active conductive material 602 (described below) formed after resistive switching material 502; oxygen migrating through the active conductive material 602 formed after resistive switching material 502; or the like.

In some embodiments, the oxidation of barrier layer 600 does not necessarily occur at any particular time during the fabrication process. Instead, in various embodiments, as oxygen from any source arrives at layer 600, the non-noble metal may oxidize. Thus, as examples, in one fabrication lot, if there is a long delay after layer 600 is formed until subsequent layers are formed, the oxidation may occur during this delay period; in another fabrication lot, if there is a long delay after a subsequent active conductive material 602 is formed over layer 600 and when a diffusion barrier material 702 (described below) is formed, the oxidation may occur during this delay period; or the like.

In various embodiments, it is currently believed that once the non-noble material in layer 600 is oxidized, it provides additional protection from subsequent oxygen from migrating down to switching material 502. For example, if layer 600 is initially a titanium nitride material, after oxidation, the titanium oxynitride material inhibits oxygen migrating from active conductive material 602 into switching material 502.

In some embodiments, such oxidized layers may disadvantageously inhibit the diffusion of conductor material of active conductive material 602, described below, from diffusing to resistive switching material 502.

As shown in FIG. 6, in some embodiments, the method includes depositing an active conductive material 602 overlying the layer 600. Active conductive material 602 can be a noble metal material such as silver, gold, platinum, palladium, alloy thereof, or others. Active conductive material 602 is characterized by a suitable diffusivity in the resistive switching material in a presence of an electric field in a specific embodiment. For amorphous silicon material as resistive switching material 502, the metal material can be silver or an alloy of silver. In some examples, the alloy of silver comprises at least 80 percent of silver.

In some examples, where active conductive material 602 is silver, silver material punches through layer 600 and forms a silver region in a portion of switching material 502 (e.g. the amorphous silicon material, $SiO_x$, $Si_xGe_yO_z$, or the like) upon application of the electric field. The silver region comprises a plurality of silver particles, including silver ions, silver clusters, silver atoms, or a combination thereof. The plurality of silver particles is formed in defect sites of the switching material in a specific embodiment. The silver region further comprises a silver filament structure extending from the source of metal (active conductive material 602), e.g. silver/silver ions, towards the first wiring material 302.

In various embodiments, the filament structure is characterized by a length, a distance between the silver particles, and a distance between the filament structure and the first electrode structure. In a specific embodiment, resistive switching material 502 (for example, the amorphous silicon material, SiOx, SixGeyOz) is characterized by a resistance depending at least on a length, a distance between the silver particles, and a distance between the filament structure and the first electrode structure (first wiring material 302). In some cases, due to material mismatch, defect density is high at an interface region formed from the amorphous silicon material (e.g. switching material 502) and the first wiring material (e.g. first wiring material 302), and may cause a short. The junction layer (e.g. junction material 402) (for example, p+ polycrystalline silicon germanium material) controls an interfacial defect density for proper switching behavior of the resistive switching device in a specific embodiment.

In some embodiments, the silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide, nitride) prior to deposition of the silver material may range from about 20 angstroms to about 50 angstroms; in other embodiments, the thickness may range from about 30 angstroms to about 40 angstroms; or the like.

In some embodiments, an additional layer of amorphous silicon may be disposed upon the top of the thin layer of (e.g. oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

In still other embodiments, layer 600 and active conductive material 602 may be formed in the same deposition step. For example, a mixture of noble and non-noble materials may be deposited in one step, alternating layers of noble and non-noble materials may be deposited in multiple steps, or the like. In various embodiments, the percentage of non-noble to noble materials may vary, for example the percentage may vary from about 0.1% to about 10%, or the like. It is believed that the non-noble material in such a mixture will also be oxidized and will reduce the amount of oxygen reaching or present in switching material 502.

Figure 7:
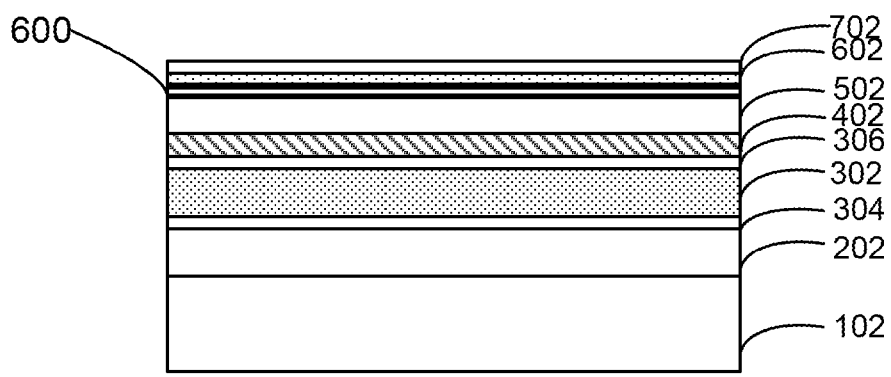
FIG. 7 is a simplified diagram illustrating a process step according to various embodiments of the present invention.

Referring to FIG. 7, the method includes forming a second diffusion barrier material 702 overlying active conductive material 602. For silver as active conductive material 602, second diffusion barrier material 702 may be a non-noble material such as titanium, titanium nitride material, tungsten, or the like. Second diffusion barrier material 702 may be formed by a physical vapor deposition process using a titanium or tungsten target material. A nitride material may be formed using a physical vapor deposition process, or a chemical vapor process or an atomic layer deposition process or by a reaction of nitrogen with the titanium material.

In various embodiments, the second diffusion barrier material 702 is formed a short period of time after active conductive material 602 is formed. As examples, the short period of time may be less than 10 minutes, 20 minutes, 1 hour, 4 hours or the like. In some examples, the short period of time is defined as less than or equal to about 1 day. By specifying a short period of time, atmospheric oxygen is inhibited from being absorbed into active conductive material 602 and/or migrating to the resistive switching material 502, layer 600 (e.g. interface between active conductive material 602 and resistive switching material 502), or the like.

In other embodiments, to reduce the amount of oxygen absorbed or contained within resistive switching material 502 or in active conductive material 602, the partially completed device is placed in an oxygen-reduced environment (e.g. substantially oxygen-free) a short time after active conductive material 602 is deposited. In some embodiments, the short period of time may be less than 15 minutes, 30 minutes, 2 hours, 4 hours or the like. In some examples, the short period of time is defined as less than or equal to about 1 day. In various embodiments, the partially completed device may be kept in the oxygen-reduced environment until the second diffusion barrier (capping) material 702 is deposited.

Figure 8:
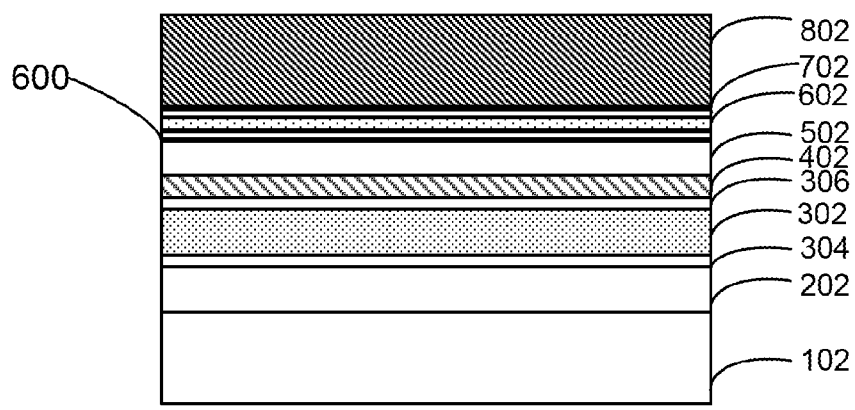
FIG. 8 is a simplified diagram illustrating a process step according to various embodiments of the present invention.

In a specific embodiment, the method includes forming a hard mask material 802 overlying second diffusion barrier material 702 as illustrated in FIG. 8. Hard mask material 802 can be a dielectric material, a metal material, a semiconductor material, or the like, depending on the application. In a specific embodiment, hard mask material can be a dielectric material such as silicon oxide, silicon nitride, a dielectric stack comprising alternating layers of silicon oxide and silicon nitride (for example, an ONO stack), a high K dielectric, a low K dielectric, and others.

Figure 9:
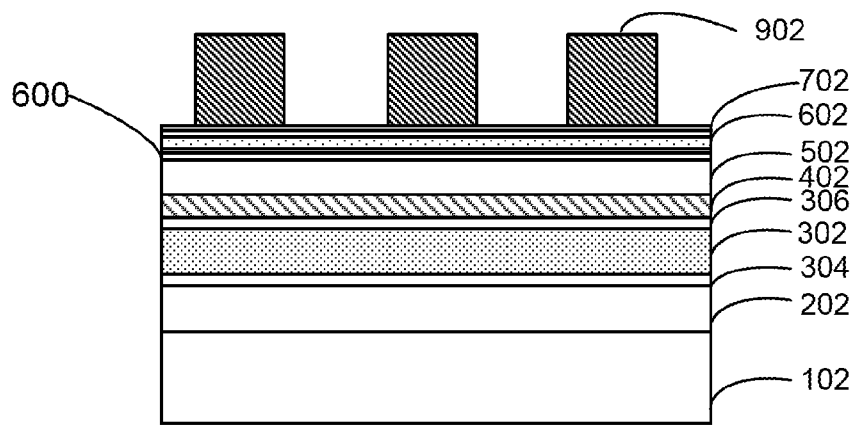
FIG. 9 is a simplified diagram illustrating a process step according to various embodiments of the present invention.

In various embodiments, hard mask material 802 is subjected to a first patterning and etching process to form a masking layer 902 as shown in FIG. 9. The first patterning and etching process may include depositing a photoresist material overlying the hard mask material, patterning the photoresist material, and etching the hard mask material using the patterned photoresist material. In other embodiments, other conventional forms of etching are contemplated.

Figure 10:
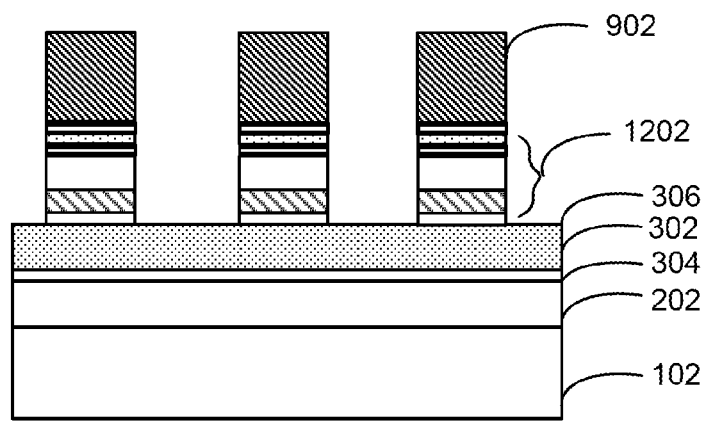
FIG. 10 is a simplified diagram illustrating a process step according to various embodiments of the present invention.

As shown in FIG. 10, the method includes subjecting a stack of material including diffusion barrier material 702, active conductive material 602, layer 600, resistive switching material 502, junction material 402, or the like to one or more etching process to form a first pillar-like structure 1202 using the hard mask 902 as a masking layer. In various embodiments, the resistive memory device is formed from the active conductive material 602, layer 600, resistive switching material 502 and junction material 402.

Figure 11:
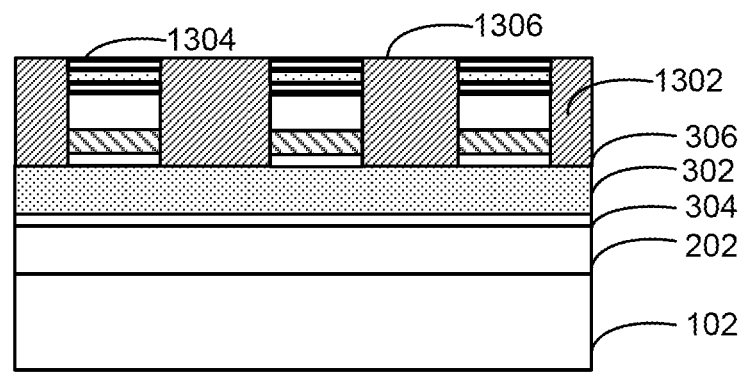
FIG. 11 is a simplified diagram illustrating a process step according to various embodiments of the present invention.

The method then removes the dielectric hard mask material remained after the above etching processes, and forms a dielectric material 1302 overlying each of the first structures and filling gaps between the first gap structures as shown in FIG. 11. Dielectric material 1302 can be silicon oxide, silicon nitride, a dielectric stack comprising alternating layers of silicon oxide and silicon nitride (for example, an ONO stack), a high K dielectric, a low K dielectric, and others. Dielectric material 1302 can be deposited using techniques such as chemical vapor deposition process, including a low pressure chemical vapor deposition process, plasma enhanced chemical vapor deposition process, high density plasma chemical vapor deposition process, atomic layer deposition process, and others, depending on the application. Dielectric material 1302 can further be planarized to expose a surface region 1304 of the barrier (or capping) material (e.g. 702) to isolate each of the first structure and to form a planarized surface 1306, as shown in FIG. 11.

Figure 12:
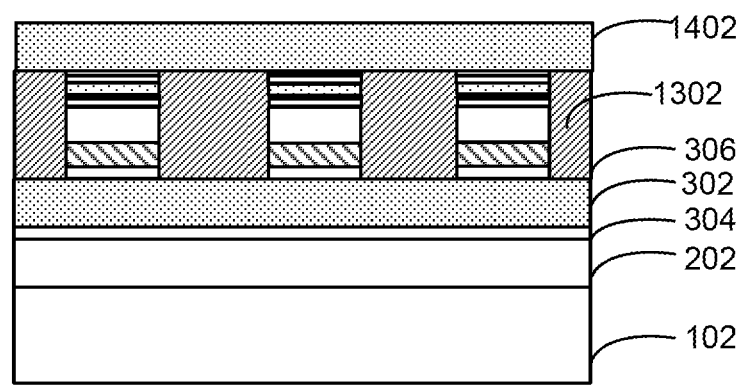
FIG. 12 is a simplified diagram illustrating a process step according to various embodiments of the present invention.

Referring to FIG. 12, a second wiring material 1402 is formed overlying the planarized surface of dielectric material 1302 and surface region 1304, or the like. Second wiring material 1402 can be a metal material such as copper, tungsten, aluminum, and others. Second wiring material 1402 can also be a suitably doped semiconductor material such as a doped polysilicon material and the likes, depending on the application.

Second wiring material 1402 is subjected to a patterning and etching process to form one or more second wiring structures. The one or more second wiring structures are elongated in shape and configured to extend in a second direction orthogonal to the first direction of the first wiring structure. Moreover, at least the resistive switching element is configured in an intersecting region of the first wiring structure and the second wiring structure in a specific embodiment. The method can further include forming passivation layers and global interconnects for the memory device, among others to complete the device.

In other embodiments, other configurations and structures are contemplated for the non-volatile memory structure. In one example, a layer of SiGe is deposited followed by a layer of SiO2. A via is then opened and the upper surface of the SiGe is amorphized to form the amorphized layer. In some examples, the layer has a thickness of approximately 2 to approximately 3 nm. In some embodiments, this process may be performed in a single Argon plasma etch step, for example. In still other embodiments, the upper surface of the SiGe may be amorphized prior to the SiO2 deposition. Subsequently, layers of Titanium, Silver, and/or Tungsten are deposited. At some time along the fabrication process, or otherwise, the bottom Titanium layer absorbs oxygen and oxidizes to become TiOx, or other non-conductive layer. In some embodiments, the oxidized layer has a thickness of approximately 3 to approximately 4 nm.

Figure 13:
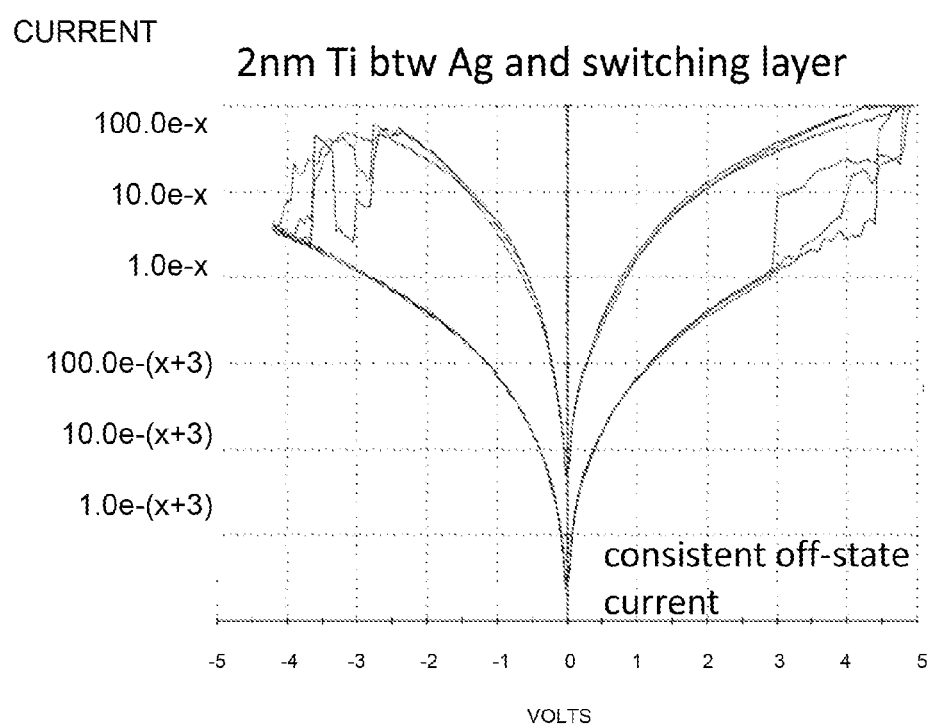
FIG. 13 illustrates a graph of performance data according to various embodiments of the present invention.

FIG. 13 illustrates a graph of performance data according to various embodiments of the present invention. More specifically, after numerous programming and erasing cycles. FIG. 13 illustrates a number of advantageous properties of the formed non-volatile memory device. One specific advantage is the consistency in response of the memory device after many different cycles.

As another example, in one embodiment, junction layer 402 and switching layer 502 may be formed as pillar structures surrounded by a blanket oxide. Subsequently, layer 600, active conductive material 602, and the like are deposited and contact upper surfaces of the pillar structures.

It is also understood that the examples and embodiments described herein are for illustrative purposes only and that various modifications or alternatives in light thereof will be suggested to persons skilled in the art and are to be included within the spirit and purview of this application and scope of the appended claims

What is claimed is:

1. A method for forming a non-volatile memory device comprises:
    disposing a junction layer comprising a doped silicon-bearing material in electrical contact with a first conductive material;
    forming a switching layer comprising an undoped amorphous silicon-bearing material upon at least a portion of the junction layer;
    disposing a layer comprising a non-noble metal material upon at least a portion of the switching layer;
    disposing an active metal layer comprising a noble metal material upon at least a portion of the layer; and
    forming a second conductive material in electrical contact with the active metal layer;
    wherein at least a portion of the non-noble metal material oxidizes into an oxidized form of the non-noble metal material after the active metal layer is disposed upon the layer to form an oxidized layer.

2. The method of claim 1 wherein the non-noble metal material is selected from a group consisting of: titanium, aluminum, tungsten, titanium alloy, aluminum alloy, tungsten alloy, titanium nitride, tungsten nitride, aluminum nitride, copper, copper alloy.

3. The method of claim 1 wherein the noble metal material is selected from a group consisting of: silver, gold, platinum, palladium.

4. The method of claim 1 wherein the layer comprises an adhesion layer having a thickness within a range of approximately 2 nm to approximately 4 nm.

5. The method of claim 1 wherein the switching layer comprises a material selected from a group consisting of: a silicon oxide, and a silicon germanium oxide.

6. The method of claim 1 wherein the oxidized layer has a thickness within a range of approximately 2 nm to approximately 3 nm.

7. The method of claim 1 wherein oxygen used to oxidize the portion of the non-noble metal material is drawn from the active metal layer.

8. The method of claim 1
    wherein the non-noble metal material comprises titanium-containing material;
    wherein the oxidized form of the non-noble metal material comprises titanium dioxide; and
    wherein the noble material comprises silver-containing material.

9. The method of claim 1
    wherein the doped silicon-bearing material comprises a p-doped polysilicon material; and
    wherein forming the switching layer comprises forming the undoped amorphous silicon-bearing material on top of at least a portion of the p-doped polysilicon material.

10. The method of claim 9
    wherein the switching layer has a thickness within a range of approximately 10 nm to approximately 30 nm.

11. The method of claim 1
    wherein the junction layer includes an upper region; and
    wherein the method further comprises subjecting the upper region of the junction layer to an amorphization process to form the undoped amorphous silicon-bearing material.

12. The method of claim 11 wherein the switching layer has a thickness within a range of approximately 2 nm to approximately 5 nm.

13. The method of claim 12 wherein the doped silicon-bearing material comprises a material selected from a group consisting of: doped silicon-germanium, doped polysilicon, p-doped silicon-germanium, and p-doped polysilicon.

14. A non-volatile memory device formed according to the process described in claim 13.

15. A non-volatile memory device comprises:
    a junction layer comprising a doped silicon-bearing material electrically coupled to a first conductive material;
    a switching layer comprising an undoped amorphous silicon-bearing material formed upon at least a portion of the doped silicon-bearing material;
    a first layer comprising a noble metal material disposed above at least a portion of the switching layer;
    a second conductive material electrically coupled to the first layer; and
    a layer comprising an oxidized form of a non-noble metal material formed between at least a portion of the first layer and at least a portion of the switching layer;
    wherein the oxidized form of the non-noble metal material is deposited as a non-oxidized form of the non-noble metal material upon the switching layer.

16. The non-volatile memory device of claim 15 wherein the switching layer comprises a material selected from a group consisting of: a silicon oxide, and a silicon germanium oxide.

17. The non-volatile memory device of claim 15
wherein the non-noble metal material comprises an adhesion material;
wherein the non-noble metal material is selected from a group consisting of:
titanium, aluminum, tungsten, titanium alloy, aluminum alloy, tungsten alloy, titanium nitride, tungsten nitride, aluminum nitride, copper, copper alloy.

18. The non-volatile memory device of claim 15 wherein the noble metal material is selected from a group consisting of: silver, gold, platinum, palladium.

19. The non-volatile memory device of claim 15
wherein the undoped amorphous silicon-bearing material comprises a material selected from a group consisting of: SiOx, SixGeyOz; and
wherein the switching layer has a thickness within a range of approximately 2 nm to approximately 5 nm.

20. The non-volatile memory device of claim 15 wherein the layer has a thickness within a range of approximately 2 nm to approximately 3 nm.

21. The method of claim 5 wherein the switching layer comprises a material selected from a group consisting of: SiOx and SixGeyOz.

* * * * *